United States Patent [19]
Kuhl et al.

[11] Patent Number: 4,781,601
[45] Date of Patent: Nov. 1, 1988

[54] HEADER FOR AN ELECTRONIC CIRCUIT

[75] Inventors: Virgil F. Kuhl, Lauderhill; Jose A. Ruiz, Tamarac; Richard D. Lipinski, Coral Springs; Guenter Noll, Ft. Lauderdale, all of Fla.

[73] Assignee: Motorola, Inc., Schaumburg, Ill.

[21] Appl. No.: 69,922

[22] Filed: Jul. 6, 1987

[51] Int. Cl.⁴ .............................................. H01R 9/07
[52] U.S. Cl. ...................................... 439/77; 361/398
[58] Field of Search ............... 439/67, 76, 77, 492, 439/498, 499; 361/395–400, 413

[56] References Cited

U.S. PATENT DOCUMENTS

| | | | |
|---|---|---|---|
| 3,492,538 | 1/1970 | Ferguson | 439/61 |
| 3,766,439 | 10/1973 | Isaacson | 361/389 |
| 4,180,304 | 12/1979 | Lerude | 439/76 |
| 4,189,199 | 2/1980 | Grau | 439/264 |
| 4,372,634 | 2/1983 | Ritchie et al. | 439/696 |
| 4,393,437 | 7/1983 | Bell et al. | 361/395 |
| 4,489,999 | 12/1984 | Miniet | 439/67 |
| 4,533,188 | 8/1985 | Miniet | 439/77 |
| 4,567,543 | 1/1986 | Miniet | 361/398 |
| 4,709,300 | 11/1987 | Landis | 361/398 |

Primary Examiner—Neil Abrams
Attorney, Agent, or Firm—Daniel K. Nichols

[57] ABSTRACT

A header for an electronic circuit includes two complementary portions. The electronic circuit is a flexible circuit with leads on opposite side edges. The opposite side leads are received by the header portions and fixed in place as by epoxy. The two header portions are then snapped together to form the header. One of the header portions includes tongues which are received in slots of the other header portions for maintaining alignment of the two portions. Clips are provided on each of the header portions for interconnecting with complementary clips of the other header portion.

4 Claims, 3 Drawing Sheets

HEADER FOR AN ELECTRONIC CIRCUIT

BACKGROUND OF THE INVENTION

This invention relates to headers for electronic circuits in general and in particular to a multi-part header. A prior header and housing assembly is illustrated in U.S. Pat. No. 4,533,188, which is assigned to the Assignee of the present invention. This header is designed to receive leads attached to a flexible circuit which can be folded to provide a compact package of the electronic parts. The header is utilized to locate the leads that are attached to the flexible circuit, so the leads can be received in a socket or a mother board.

With the circuit board folded and leads inserted in the header, access to many of the circuit components is greatly restricted. In order to gain access to all of the components on the flexible circuit, it is necessary to remove the leads from the header. Insertion and removal of the leads in the header entail risk of damage to the connection of the leads to the circuit. It is therefore desirable to provide a header that is both capable of maintaining alignment of the leads while permitting full access to the components of the flexible circuit without removing the leads from the header.

SUMMARY OF THE INVENTION

This header for an electronic circuit includes complementary header portions that can be selectively interconnected for forming the header and selectively disconnected for providing access to the components on the flexible circuit.

The header for an electronic circuit assembly includes first and second complementary portions. Each of the header portions include means for receiving the electronic circuit and mating means for selectively interconnecting the header portions to form the header.

In one aspect of the invention, the mating means includes alignment means for maintaining alignment of the header portions when interconnected. In another aspect of the invention, the alignment means includes complementary tongues and slots on the header portions. The tongues of one header portion are received in the slots of the other header portion for maintaining alignment of the header portions.

In still another aspect of the invention, the mating means includes latching means for maintaining interconnection of the header portions. In another aspect of the invention, the latching means includes pairs of upper and lower clips on each header portion. The upper clips of each header portion selectively mate with the lower clips of the other header portion for maintaining interconnection of the header portions.

Figure 1:
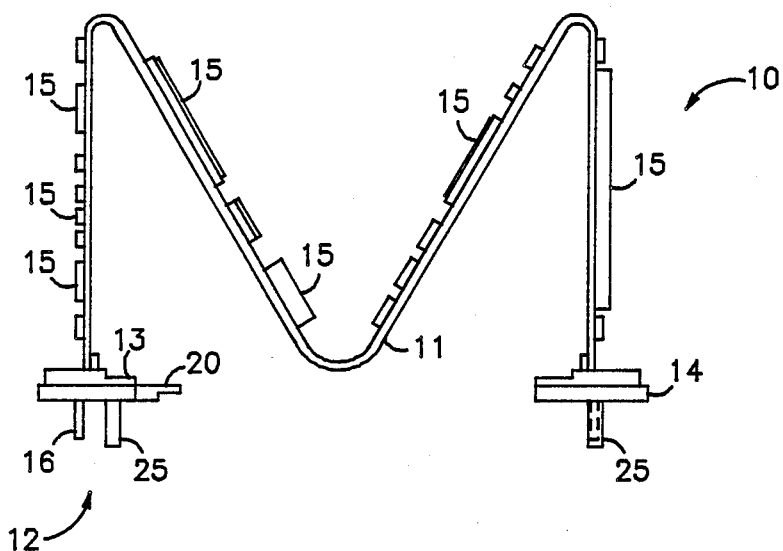
FIG. 1 is a side elevational view of a header and an electronic circuit assembly with the header portion separated.

DESCRIPTION OF THE PREFERRED EMBODIMENT:

Referring now by characters of reference to the drawings and first to FIG. 1, it will be understood that the header and electronic circuit assembly, generally indicated by 10, includes a flexible electronic circuit 11 and a header 12 formed by complementary header portions or halves 13 and 14.

The flexible circuit 11 includes a plurality of electronic components all designated as 15 which are electrically connected to provide a desired electric circuit. The flexible circuit 11 includes a plurality of leads 16 which can be clipped and soldered to the circuit 11 for providing electrical connection to the circuit 11. The leads 16 are received through openings 17 of the header 12 comprising means for receiving the electronic circuit 11, as most clearly illustrated in FIG. 3.

Figure 2:
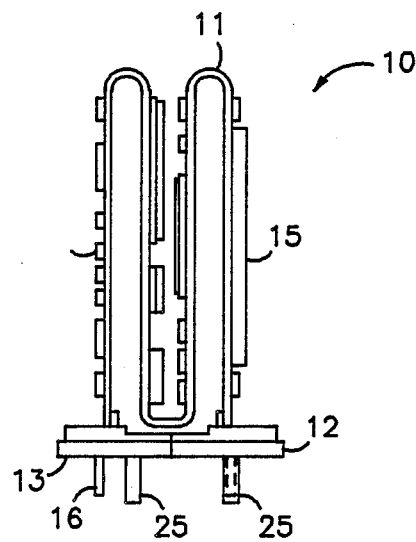
FIG. 2 is a side elevational view of the header and electronic circuit of FIG. 1 with the header portion interconnected.
Figure 4:
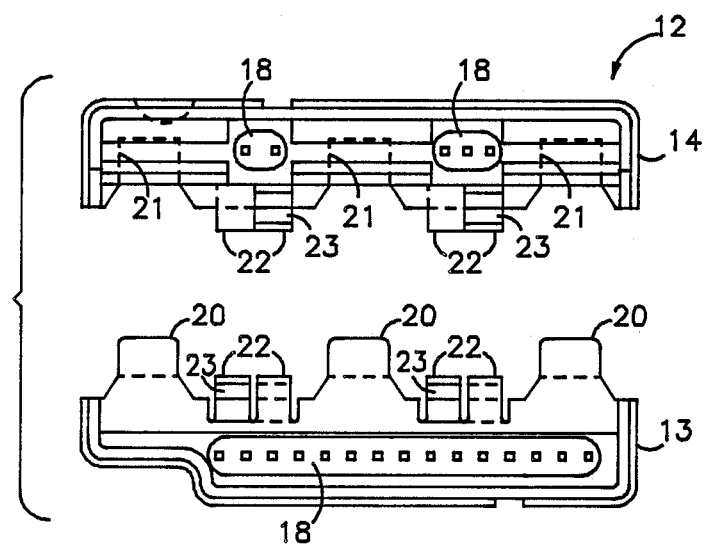
FIG. 4 is a top plan view of the header portions.

The header portions 13 and 14 are positioned to receive leads 16 of opposite ends of the flexible circuit 11. Epoxy 18, as shown in FIG. 4, is applied about the leads 16 to bond the leads to the header portions 13 and 14. After the leads 16 have been attached to the header portions 13 and 14, the flexible circuit 11 can be folded and the two portions can be interlocked as illustrated in FIG. 2 to complete the header and electronic circuit assembly 10.

Figure 3:
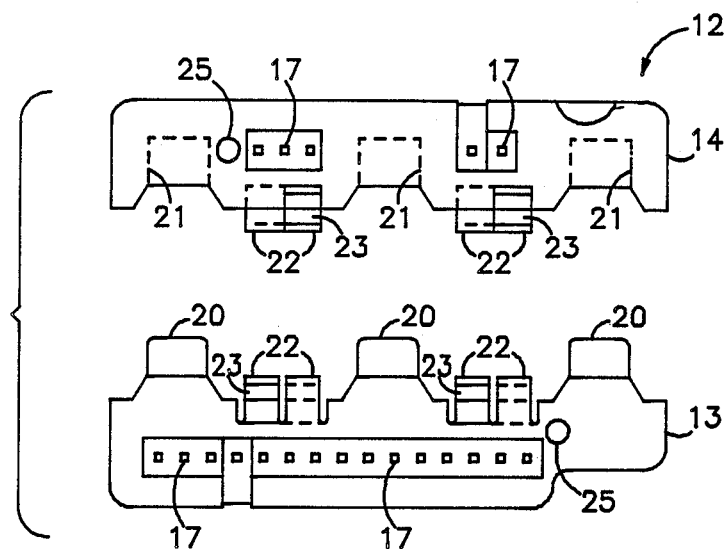
FIG. 3 is a bottom plan view of the header portions.
Figure 5:
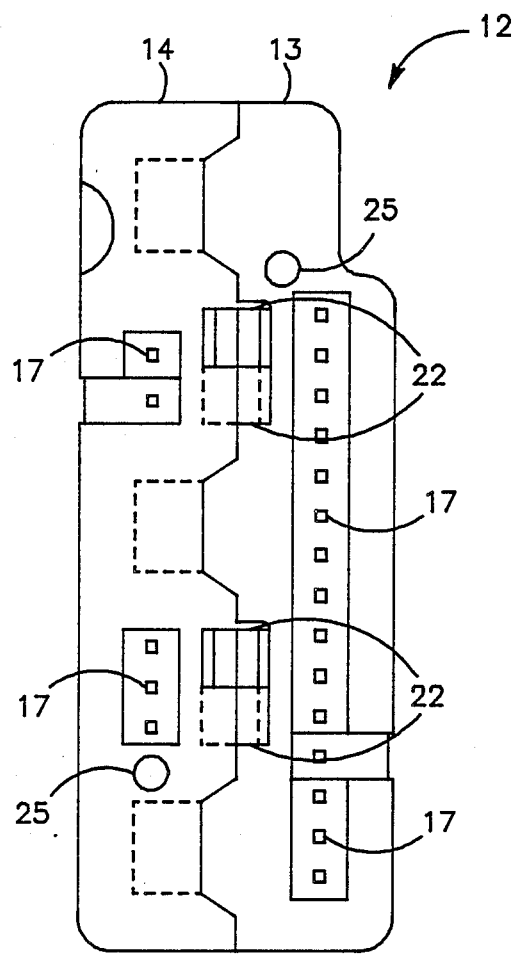
FIG. 5 is a bottom plan view of the assembled header portions.

The construction of the header portions 13 and 14 is illustrated in detailed in FIGS. 3-5. In the preferred embodiment, the header portions 13 and 14 are each formed as unitary items of molded nylon. Alignment means comprising tongues 20 on header portion 13 and corresponding slots 21 on header portion 14 are used for precise alignment of the header portions 13 and 14 for assembly. Each of the header portions 13 and 14 includes latching means comprising a plurality of clips 22 having protrusions 23, the clips 22 are designed for interconnection with corresponding clips 22 of the opposite header portion. As illustrated, each of the clips 22 are either to upper or lower clips, with the upper clips having the protrusions 23 on their lower sides and the lower clips 22 having their protusions 23 on their upper sides. In assembly, a lower clip portion 22 of one of the inner portions 13 and 14 would attach to an upper clip portion 22 of the opposite header portion. The alignment means and latching means comprise mating means.

In the preferred embodiment, the clips 22 are provided on each of the header portions 13 an 14 in adjacent pairs with one of each adjacent pair being an upper clip and the other being a lower clip. During assembly, the clip portions 13 and 14 are pushed together with the tongues 20 being received in the slots 21. Interconnecting clips 22 engage and flex with the protrusions riding over each other and then interlocking the header portions 13 and 14. To disassemble the two header portions 13 and 14, they are pulled apart with the clips 22, flexing to unlatch and permit the tongues 20 to be removed from the slots 21.

Each of the header portions includes a depending pin 25 which can be utilized for alignment purposes when inserting the pins 16 into a socket or circuit board (not shown).

In use the pins are inserted through the header portions 13 and 14. The flexible circuit is folded and the header 12 is snapped together. The assembly 10 can then be inserted in a socket or circuit board for connection to other circuits. If it is desired to access any of the electronic components 15, the assembly 10 can be withdrawn from the socket or circuit board. The header portions 13 and 14 can then be pulled apart allowing access to the components 15. The assembly 10 can be reassembled by refolding the flexible circuit 11 and again snapping the header portions 13 and 14 together.

We claim as our invention:

1. A header and electronic circuit assembly comprising:
    a flexible circuit carrying a plurality of electronic components and having opposed sides;
    a plurality of leads affixed to each of the opposed sides of the flexible circuit,
    a header means including first and second header portions, each being formed with mating means for interconnection of the header portions,
    the first header portion receiving leads affixed to one of the sides of the flexible circuit and the second header portion receiving leads affixed to the other of the sides of the flexible circuit, and
    the flexible circuit being foldable for permitting interlocking of the first and second header portions, and
    the mating means including alignment means having complementary tongues and slots on the header portions, the tongue of one header portion being received in the slot of the other header portion for maintaining alignment of the header portions when interconnected, and
    the mating means including latching having pairs of upper and lower clips on each header portion, the upper clips of each header portion selectively mating with lower clips of the other header portion for maintaining interconnection of the header portions.

2. A header and electronic circuit assembly as defined in claim 1, in which:
    the leads received by the first and second header portions are bonded to the header portions by epoxy.

3. A header and electronic circuit assembly as defined in claim 2, in which:
    the header portions are formed of molded nylon.

4. A header and electronic circuit assembly as defined in claim 1, in which:
    each of the header portions is formed with a depending alignment pin.

* * * * *